US012647105B2

(12) United States Patent
Ahmed

(10) Patent No.: US 12,647,105 B2
(45) Date of Patent: Jun. 2, 2026

(54) METHOD AND APPARATUS FOR FINITE IMPULSE RESPONSE FILTER UNDER CONSTRAINED SAMPLING RATE

(71) Applicant: Jabil Inc., St. Petersburg, FL (US)

(72) Inventor: Walid Khairy Mohamed Ahmed, St. Petersburg, FL (US)

(73) Assignee: Jabil Inc., St. Petersburg, FL (US)

( * ) Notice: Subject to any disclaimer, the term of this patent is extended or adjusted under 35 U.S.C. 154(b) by 393 days.

(21) Appl. No.: 18/015,370

(22) PCT Filed: Jul. 12, 2021

(86) PCT No.: PCT/US2021/041257
§ 371 (c)(1),
(2) Date: Jan. 10, 2023

(87) PCT Pub. No.: WO2022/015640
PCT Pub. Date: Jan. 20, 2022

(65) Prior Publication Data
US 2023/0283263 A1     Sep. 7, 2023

Related U.S. Application Data

(60) Provisional application No. 63/050,913, filed on Jul. 13, 2020.

(51) Int. Cl.
*H03H 17/00*     (2006.01)
*H03H 17/02*     (2006.01)
*H03H 17/06*     (2006.01)

(52) U.S. Cl.
CPC .... *H03H 17/0642* (2013.01); *H03H 17/0267* (2013.01); *H03H 2017/0081* (2013.01)

(58) Field of Classification Search
None
See application file for complete search history.

(56) References Cited

U.S. PATENT DOCUMENTS 4,725,972 A     2/1988   Gockler
6,975,689 B1 *  12/2005  McDonald ........ H04L 25/03159
                                              375/346
(Continued)

FOREIGN PATENT DOCUMENTS

EP          1134892 A1      9/2001
JP        2012-249294 A    12/2012
KR    10-2007-0085809 A     8/2007

OTHER PUBLICATIONS

Gockler H. G. et al., "Minimal Block Processing Approach to Fractional Sample Rate Conversion", Signal Processing, Elsevier, Amsterdam. NL, vol. 81, No. 4, Apr. 1, 2001, pp. 673-691, XP004234871, ISSN: 0165-1684, DOI. 10.1016/S0165-1684(00)00221-8.

*Primary Examiner* — Ariel Mercado-Vargas
(74) *Attorney, Agent, or Firm* — Young Basile Hanlon & MacFarlane, P.C.

(57)     ABSTRACT

Methods and systems for finite impulse response filter under a constrained sampling rate. A method for constrained sampling rate filtering includes segmenting an input signal with a first rate into a defined number of streams, wherein the defined number of streams sets an effective sample rate of each stream to at least less than a second rate and the second rate is less than the first rate, determining filter coefficients for a finite impulse response filter, grouping the filter coefficients into subsets of filter coefficients to match the defined number of streams, applying in parallel, for each of the defined number of streams, a subset of filter coefficients to a corresponding stream, and combining at least some outputs from the defined number of streams conditionally based on the second rate.

20 Claims, 22 Drawing Sheets

(56)　　　　　　　References Cited

U.S. PATENT DOCUMENTS

| | | | |
|---|---|---|---|
| 7,194,039 B2 | 3/2007 | Hunton | |
| 8,539,012 B2 * | 9/2013 | Clark | H03H 17/0283 |
| | | | 708/313 |
| 8,687,689 B2 * | 4/2014 | Baraniuk | H03M 13/11 |
| | | | 375/240.01 |
| 2002/0191709 A1 * | 12/2002 | Hunton | H04L 25/03343 |
| | | | 375/295 |
| 2006/0103555 A1 | 5/2006 | Antonesei | |
| 2006/0114974 A1 | 6/2006 | Zeira et al. | |
| 2010/0135435 A1 | 6/2010 | Visalli et al. | |
| 2010/0158178 A1 * | 6/2010 | Sobchak | H03H 17/0685 |
| | | | 375/355 |
| 2012/0308029 A1 | 12/2012 | Christoph | |
| 2013/0051211 A1 * | 2/2013 | Bailey | G11B 20/10009 |
| 2013/0054663 A1 * | 2/2013 | Aravind | H03H 17/0685 |
| | | | 708/300 |
| 2013/0211827 A1 * | 8/2013 | Savell | G11B 20/10527 |
| | | | 704/207 |
| 2014/0119485 A1 * | 5/2014 | Seo | H04L 27/2659 |
| | | | 375/349 |
| 2016/0196831 A1 * | 7/2016 | Groeschel | H03H 17/0455 |
| | | | 381/97 |
| 2018/0316482 A1 * | 11/2018 | Gudovskiy | H03H 17/0642 |
| 2019/0013032 A1 | 1/2019 | Craven et al. | |

* cited by examiner

METHOD AND APPARATUS FOR FINITE IMPULSE RESPONSE FILTER UNDER CONSTRAINED SAMPLING RATE

CROSS-REFERENCE TO RELATED APPLICATION(S)

This application is a national stage entry of International Patent Application Serial No. PCT/US2021/041257, filed Jul. 12, 2021, which claims priority to U.S. Provisional Application Ser. No. 63/050,913, filed Jul. 13, 2020, the entire disclosures of which are incorporated herein.

TECHNICAL FIELD

This disclosure relates to communication devices and systems.

BACKGROUND

Mixed-signal systems include both analog circuits and digital circuits on a single semiconductor die and process both analog and digital signals together. For example, an analog-to-digital converter (ADC) is a mixed-signal component. Mixed-signal systems can include, for example, Field Programmable Gate Arrays (FPGAs) system on chip systems.

In some mixed-signal systems, a digital-to-analog (DAC) or an ADC fabric is capable of handling high sample-rates while subsequent digital circuitry on the chip is limited to a smaller sample-rate. Typically, in such systems, an ADC, for example, is equipped with divide-by-2 successive decimation (down-sampling) stages to take the sample-rate from the higher ADC rate to a rate that is equal or smaller than what the subsequent digital circuitry can handle.

This leads to a special situation where a signal incoming to the ADC, for example, needs to be sample-rate converted to the desired rate, but it is not possible since the sample-rate conversion rate is higher than what the computing circuitry can handle.

SUMMARY

Disclosed herein are methods and systems for finite impulse response filter under constrained sampling rate.

In implementations, a method for constrained sampling rate filtering includes segmenting an input signal with a first rate into a defined number of streams, wherein the defined number of streams sets an effective sample rate of each stream to at least less than a second rate and the second rate is less than the first rate, determining filter coefficients for a finite impulse response filter, grouping the filter coefficients into subsets of filter coefficients to match the defined number of streams, applying in parallel, for each of the defined number of streams, a subset of filter coefficients to a corresponding stream, and combining at least some outputs from the defined number of streams conditionally based on the second rate.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
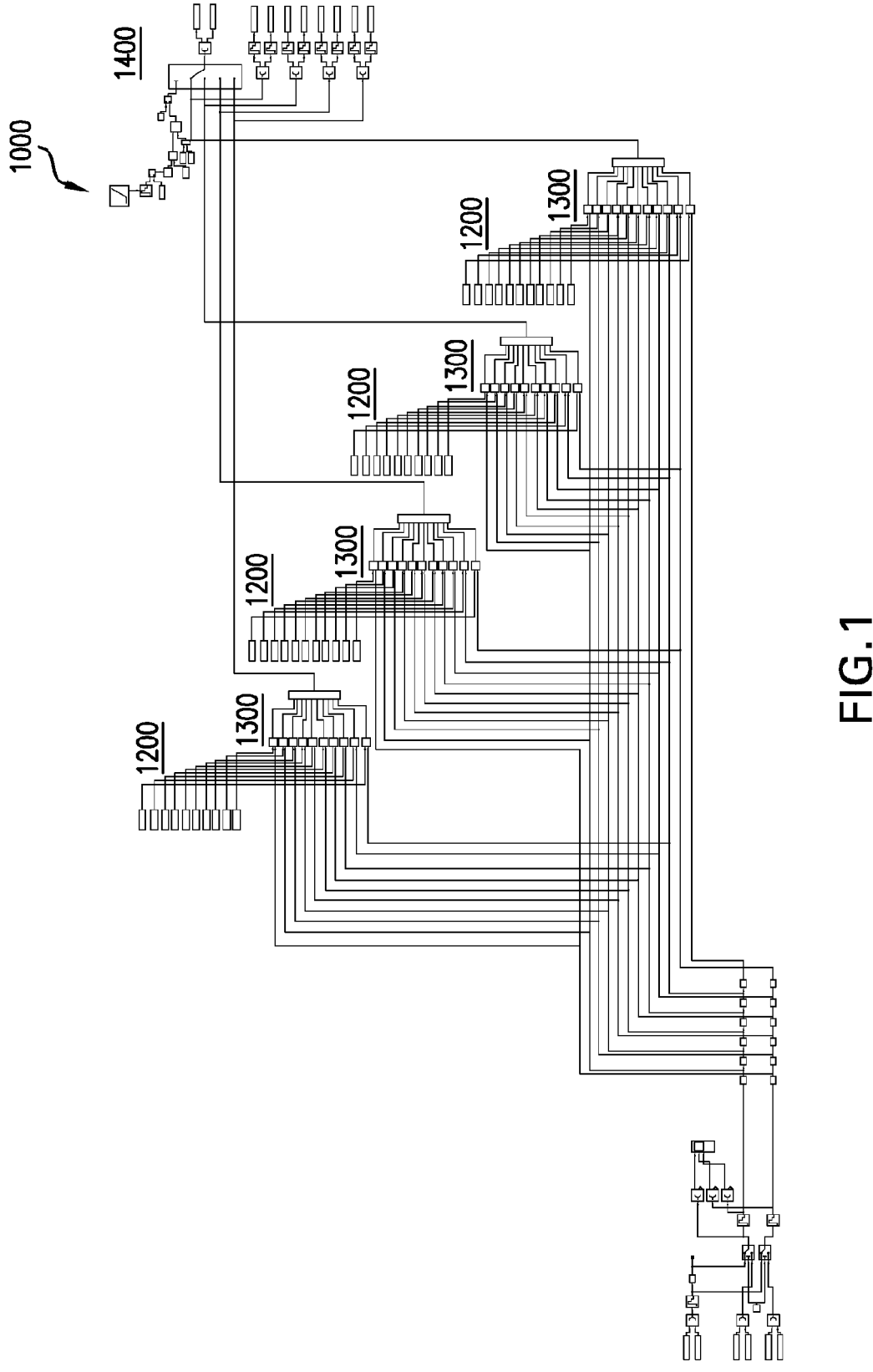
FIG. 1 is a block diagram of an example filter in accordance with embodiments.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. For example, the "computer" or "computing device" may include at least one or more processor(s).

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks, or activities. For example, applications may perform one or more functions including, but not limited to, telephony, web browsers, e-commerce transactions, media players, travel scheduling and management, smart home management, entertainment, and the like. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions, and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Mixed-signal systems can have situations where a signal incoming to a component such as an analog-to-digital converter (ADC), for example, needs to be sample-rate converted to the desired rate, but it is not possible since the sample-rate conversion rate is higher than what the computing circuitry can handle. For example, assume that the ADC sample (clock) rate is 2.9491 Gsps. The ADC module can produce a down-sampled stream at 2.9491/2=1.4746 Gsps, 2.9491/4=737.28 Msps or 2.9491/8=368.64 Msps. The incoming signal at the ADC input has a BW of 400 Msps. The post-ADC circuitry can handle up-to 491.52 Msps. Hence, the post-ADC circuitry maximum sample-rate satisfies Nyquist requirement with regard to the signal BW. However, the ADC module can't be set to an ADC down-sample ratio of 8 since that will alias the signal, and if the ADC down-sample ratio is set to 4, the ADC output will be at 737.28 Msps which is faster than the post-ADC circuitry can handle in terms of signal processing computations.

There are no signal-processing blocks or algorithms available to convert the sample-rate from 737.28 Msps to 491.52 Msps (e.g., a $\frac{2}{3}$ decimation sample-rate-converter (SRC)) with post-circuitry that can handle up-to 491.52 Msps only. Traditional finite impulse response (FIR) and polyphase structures and algorithms are designed to process the signal at the actual sample-rate of the SRC input. That is, assuming the SRC can process at the 737.28 Msps directly, not somehow equivalently process at a rate of 491.52 or smaller. The above limitation can be a show-stopper for building a cost-effective silicon 5G transceiver that can handle up-to 400 MHz BW RATs/signals. As known in the industry, a 400 MHz BW 5G scenario is a challenging scenario to achieve with cost-effective hardware but is a desirable 5G feature that operators and OEMs would like to support.

Described herein are methods, devices, and systems for finite impulse response filter under constrained sampling rate. A filter structure can be implemented by rearranging the FIR processing computation. The following terms are defined as described for purposes of this specification and the ADC is used as an illustrative circuit as the specification is applicable to other appropriate devices or circuits:

a. Fs_ADC is the ADC output sample rate.

b. Fs_Max is the maximum rate a post-ADC circuitry (or similar circuit) can handle.

c. Fs_Nyquist is the desired sample-rate to convert to from Fs_ADC.

d. Fs_Process is the actual processing sample-rate at which to implement the sample-rate-conversion from Fs_ADC to Fs_Nyquist.

where i. Fs_Process≤Fs_Max≤Fs_ADC ii. Fs_Nyquist≤Fs_Max e. BW_Sig is the signal BW.

f. K=Fs_ADC/Fs_Process g. N/M=Fs_Nyquist/Fs_ADC where the N/M SRC FIR filter entails L number of filter coefficients at the Fs_ADC sample-rate.

The canonic (traditional) FIR processing computation is written as follows:

$$y_n = \sum_{l=0}^{L-1} h_{n-1} \cdot x_n$$

Where $x_n = 0$; $n \neq N \cdot j$; $j = 0, 1, 2, \ldots$ $x_n = x_{j,input}$; Otherwise $y_{m,output} = y_n$; $n = M \cdot i$; $i = 0, 1, 2, \ldots$ Without loss of generality and for simplicity of notation, let the number of required filter taps be $L = \gamma N$; where $\gamma$ is an integer. If the optimal filter design requires L that is not an integer multiple of N then augment the filter taps by zeros until the total number of taps adds up to an integer multiple of N.

Form K buffers, each running at Fs_Process clock (update) rate.

Denote the content of each buffer:

$x_{k,j} = [x_{j+k}, x_{K+j+k}, x_{2K+j+k}, x_{3K+j+k} \cdots x_{ZK+j+k}]$

Where $$Z \geq \left\lfloor \frac{L}{N} \right\rfloor$$

$$k = 0, 1, 2, \ldots, K - 1$$

$$j = 0, 1, 2, 3 \ldots$$

Figure 1A:
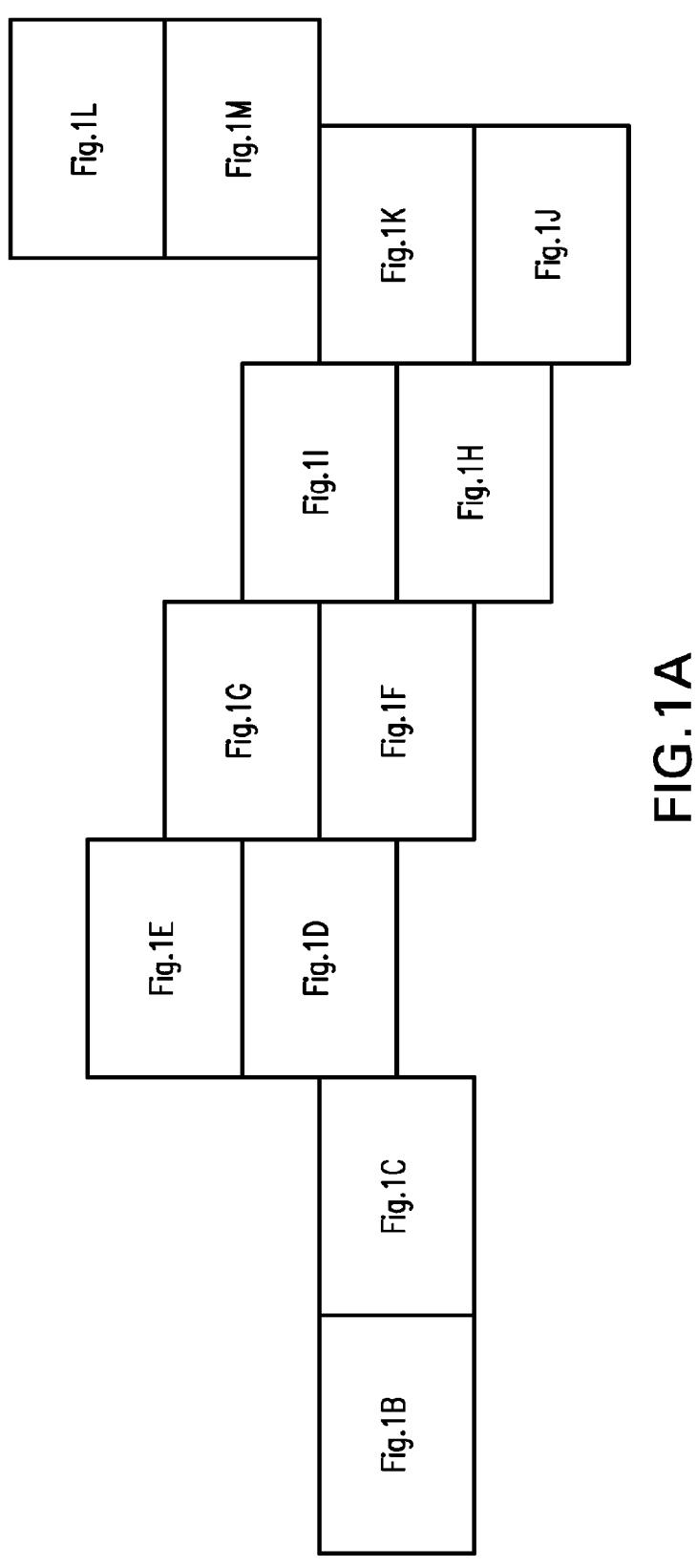
FIG. 1A is a layout diagram for FIGS. 1B-1M which are exploded views of FIG. 1.
Figure 1B:
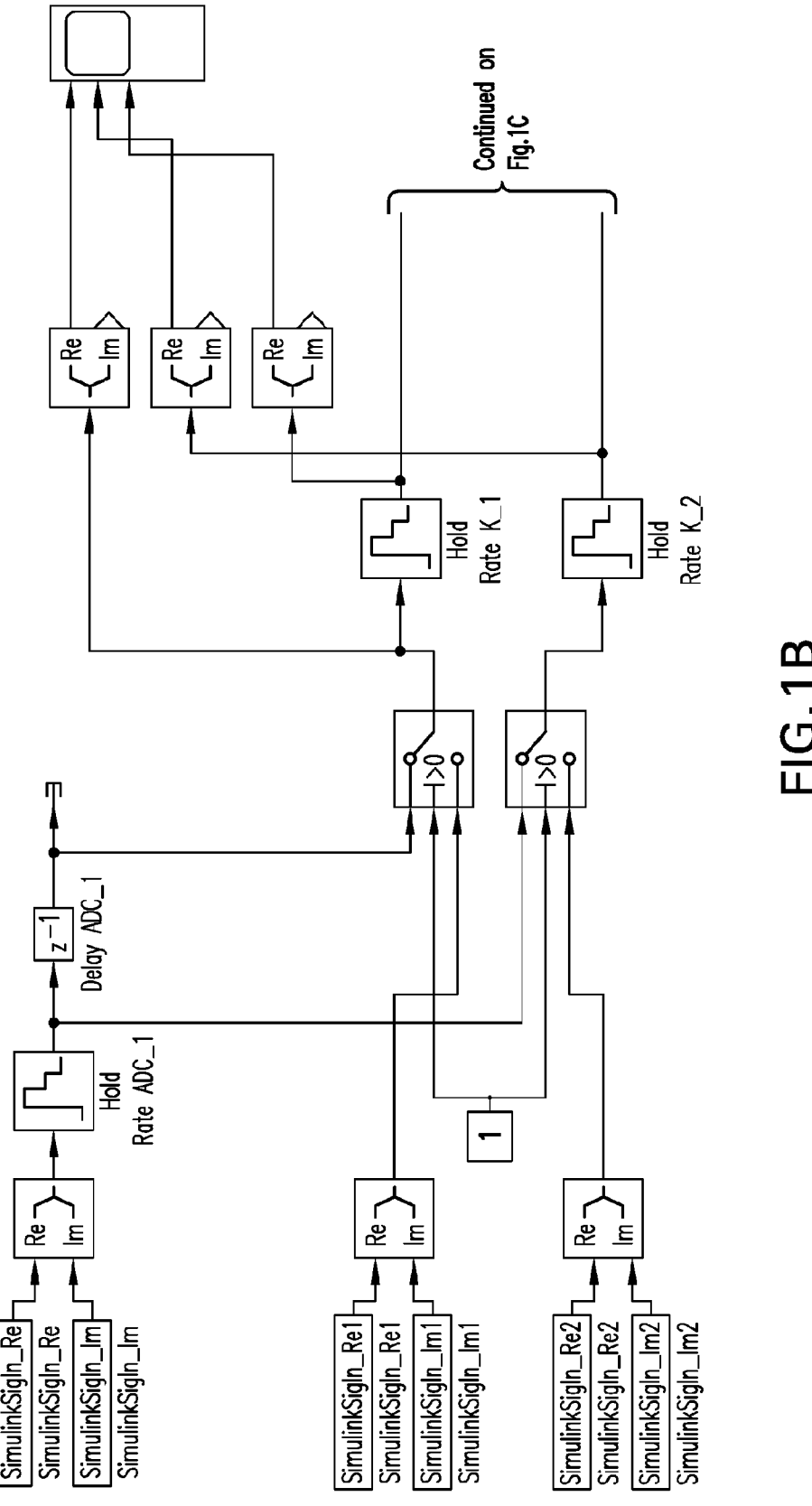
Figure 1C:
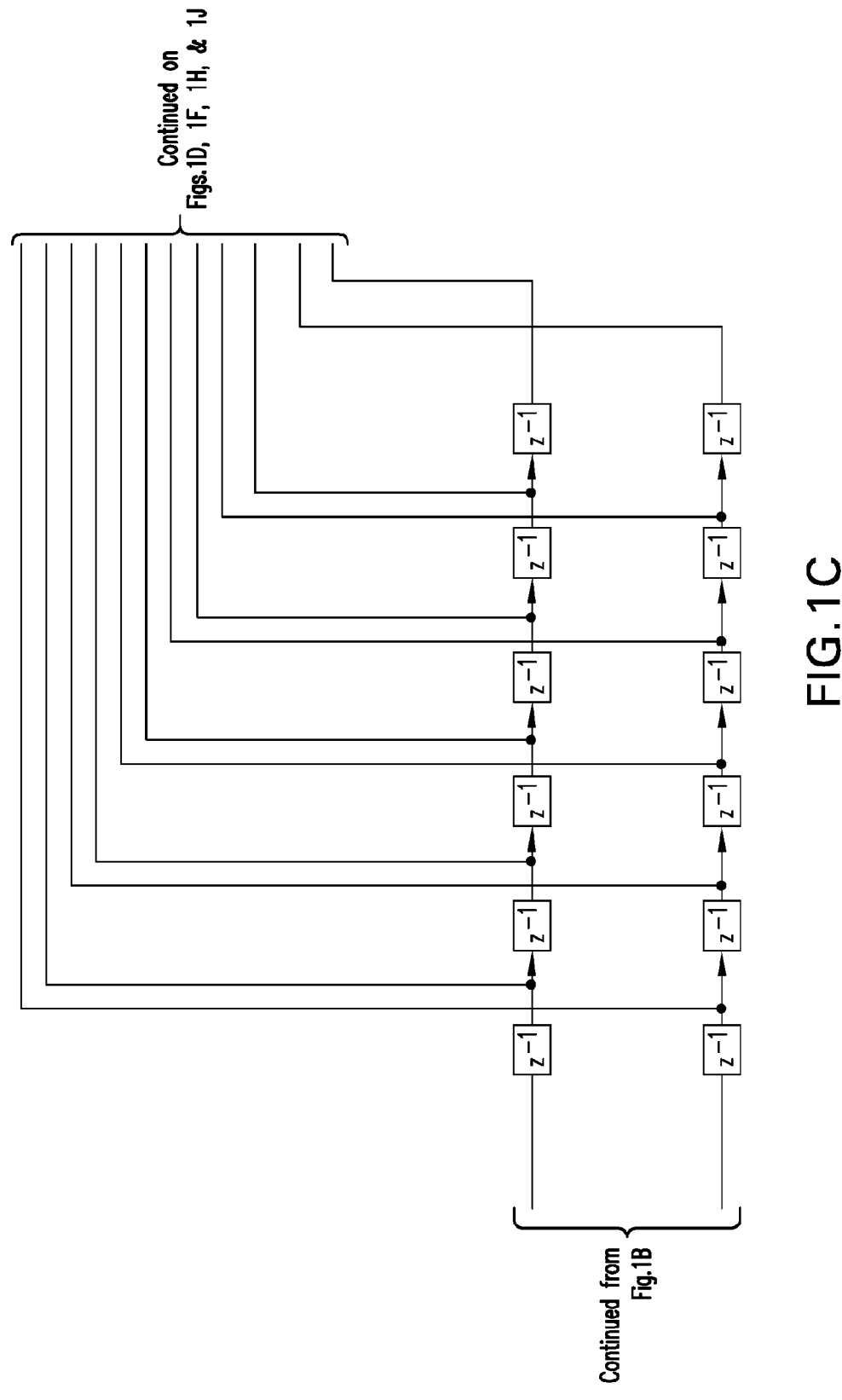
Figure 1D:
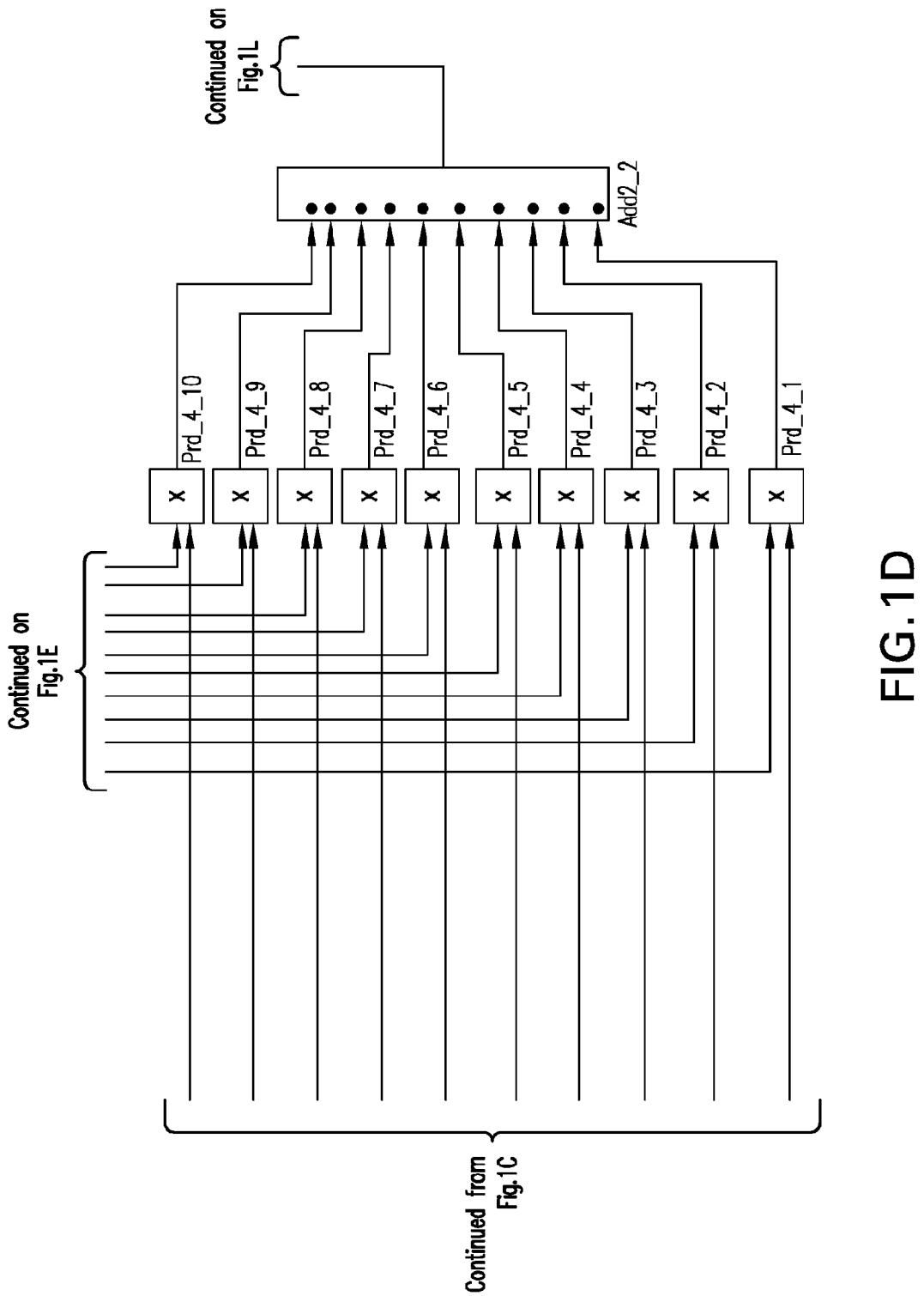
Figure 1E:
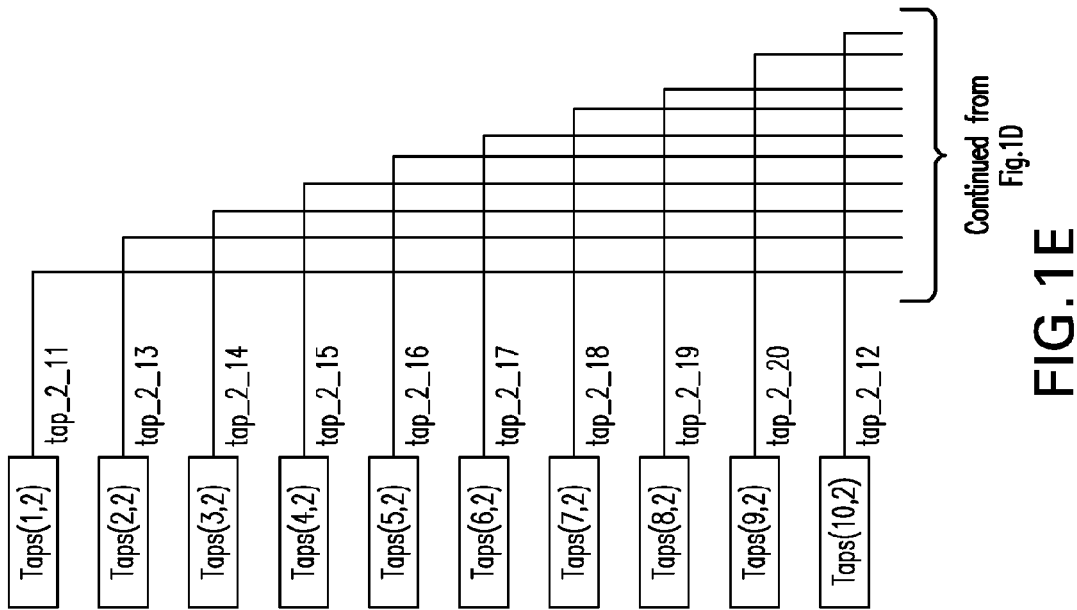
Figure 1F:
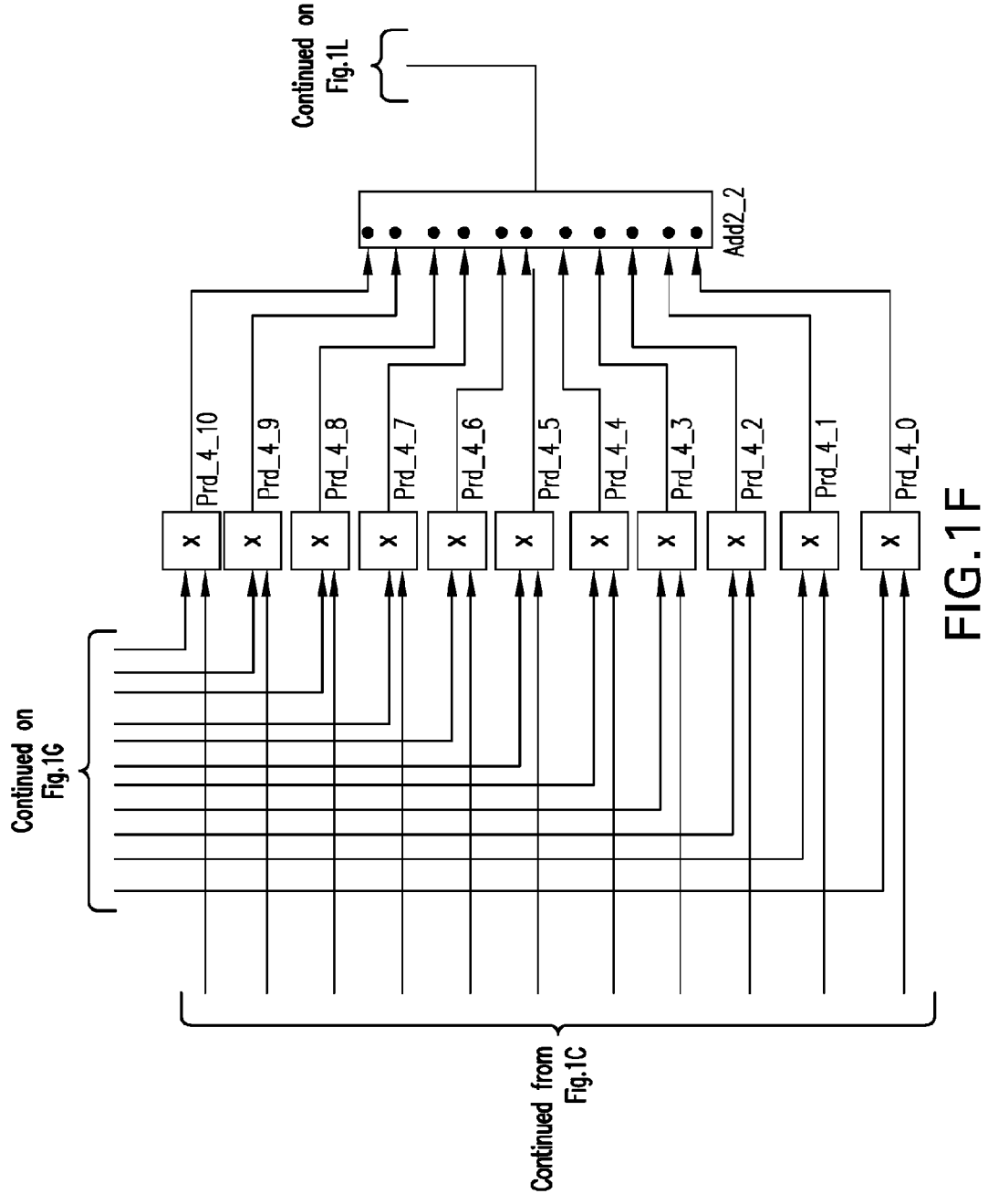
Figure 1G:
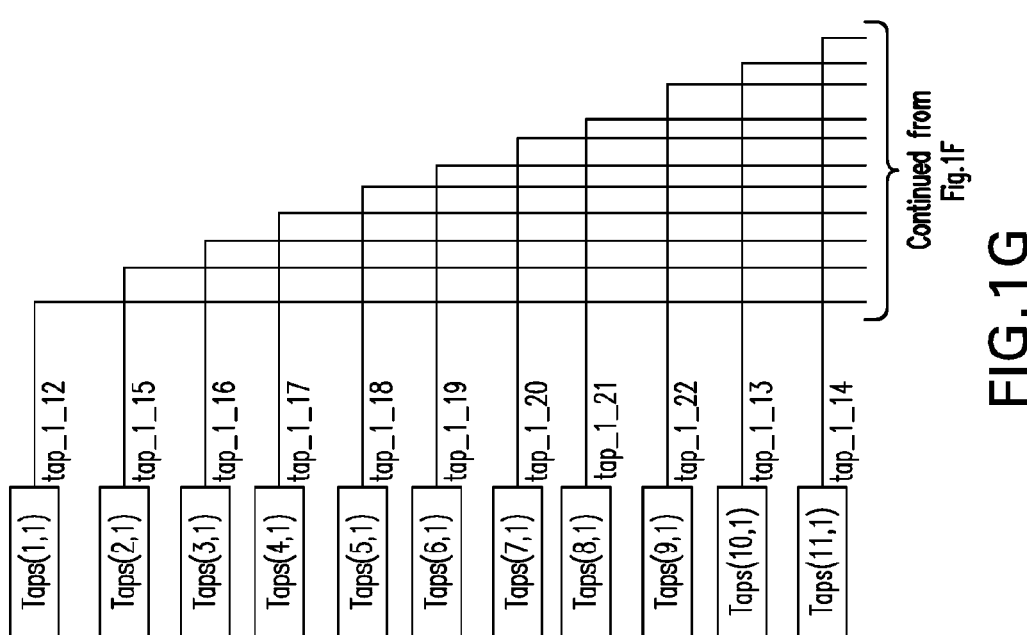
Figure 1H:
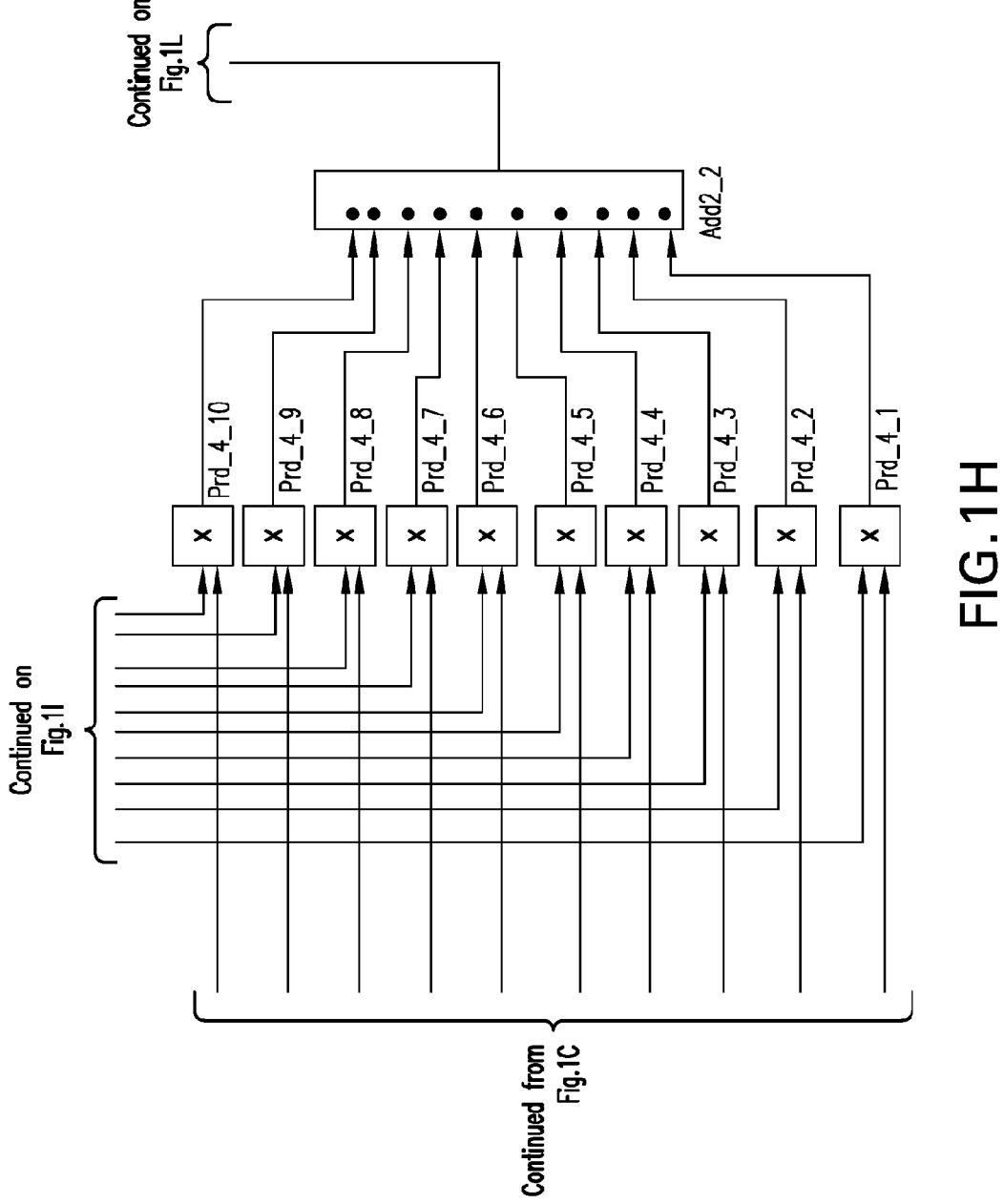
Figure 1I:
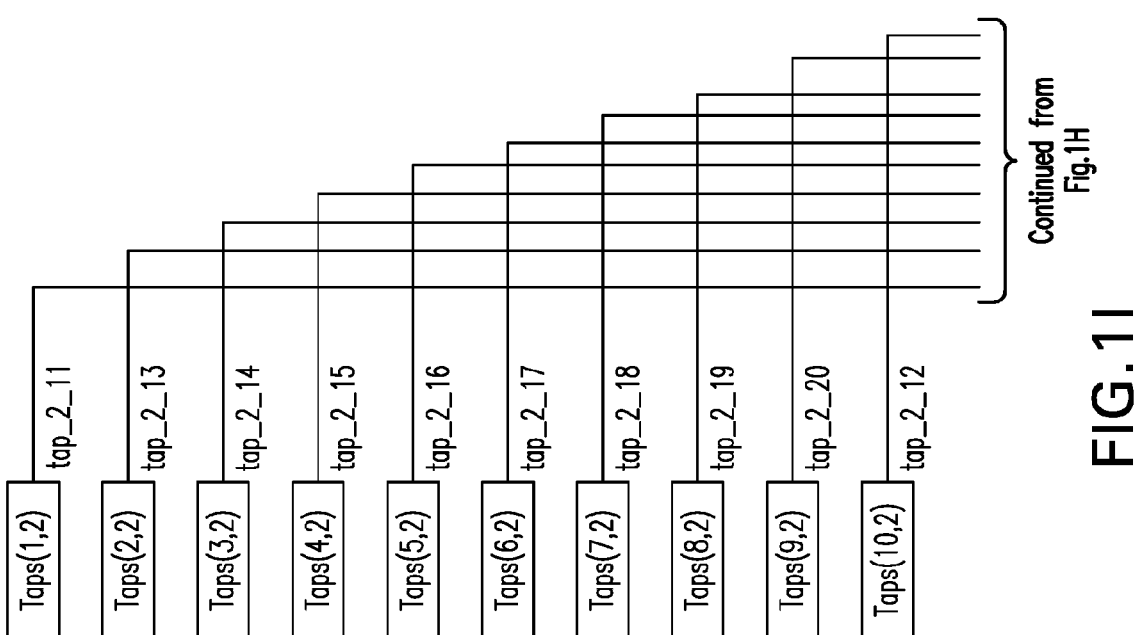
Figure 1J:
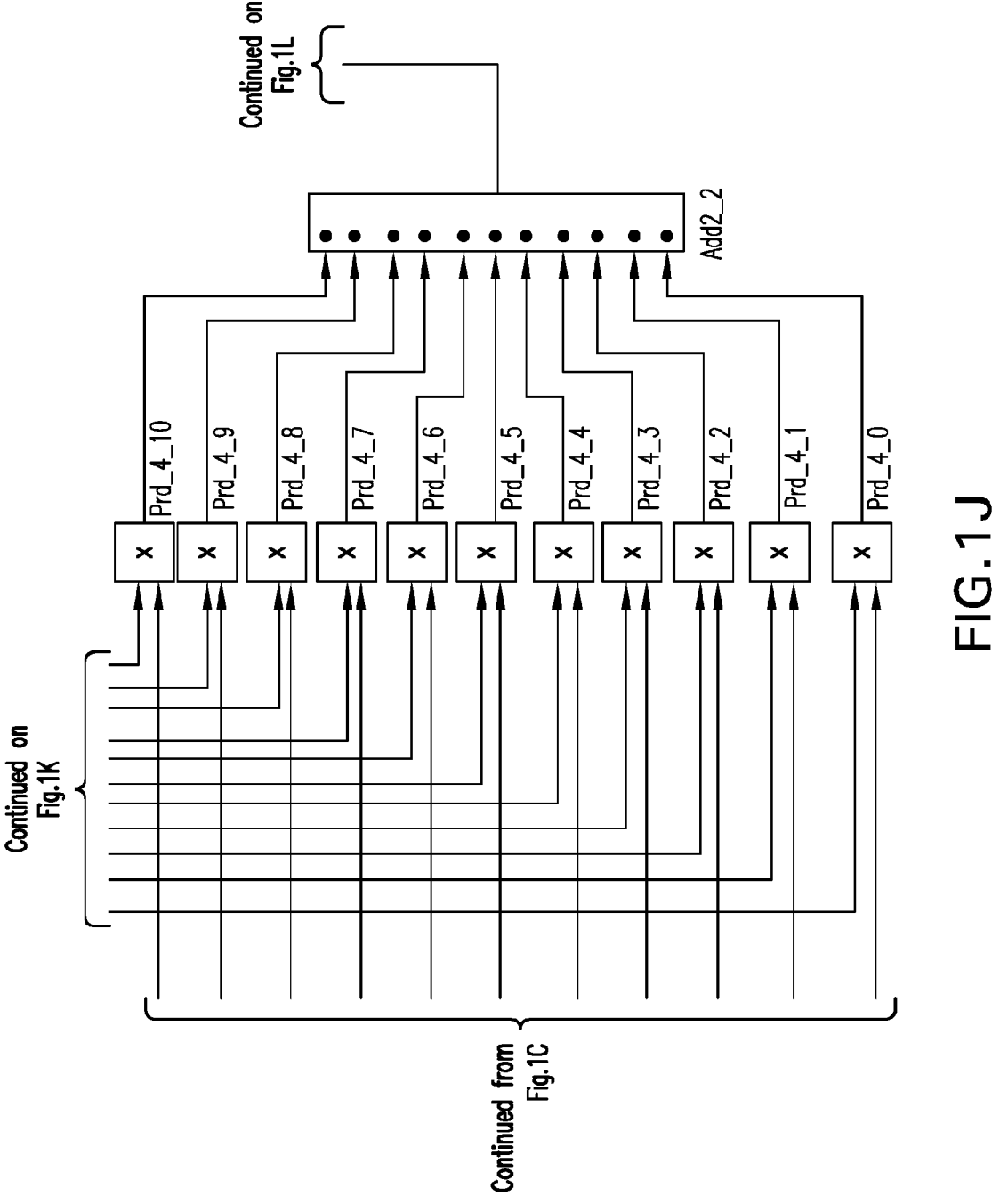
Figure 1K:
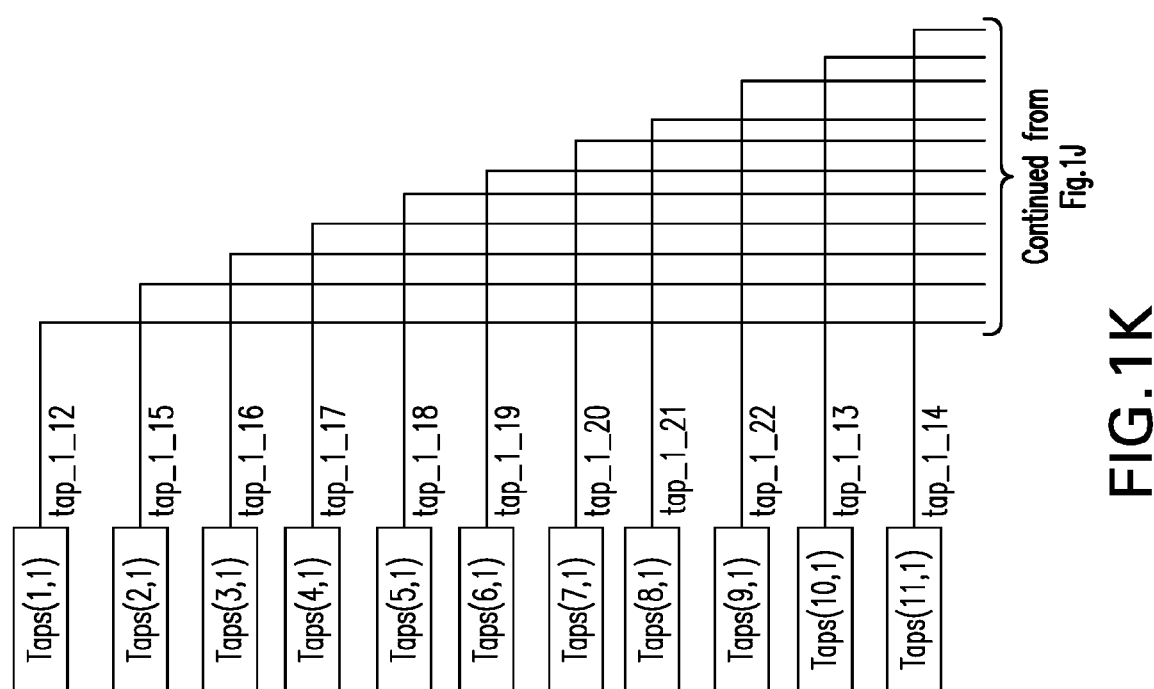
Figure 1L:
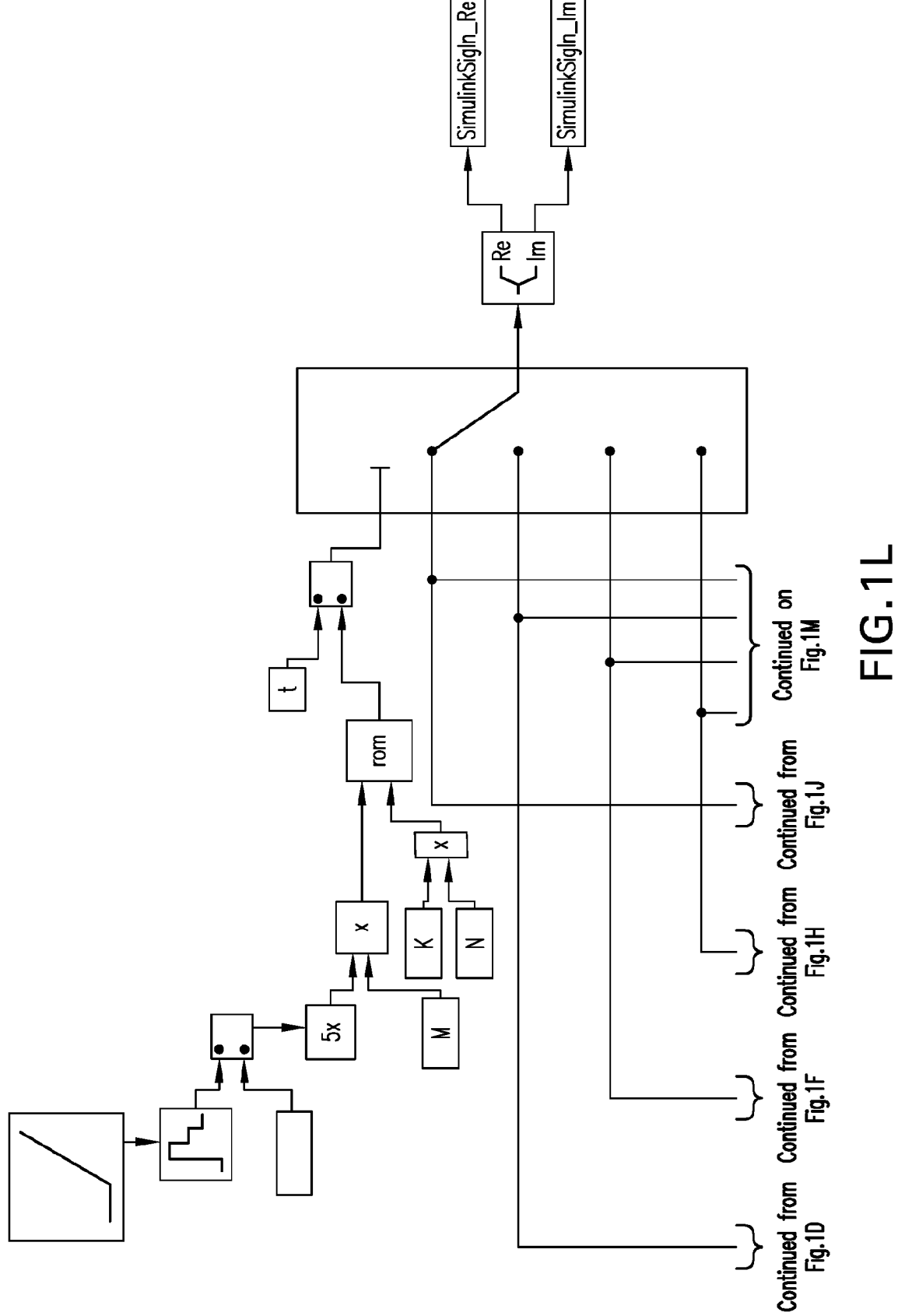
Figure 1M:
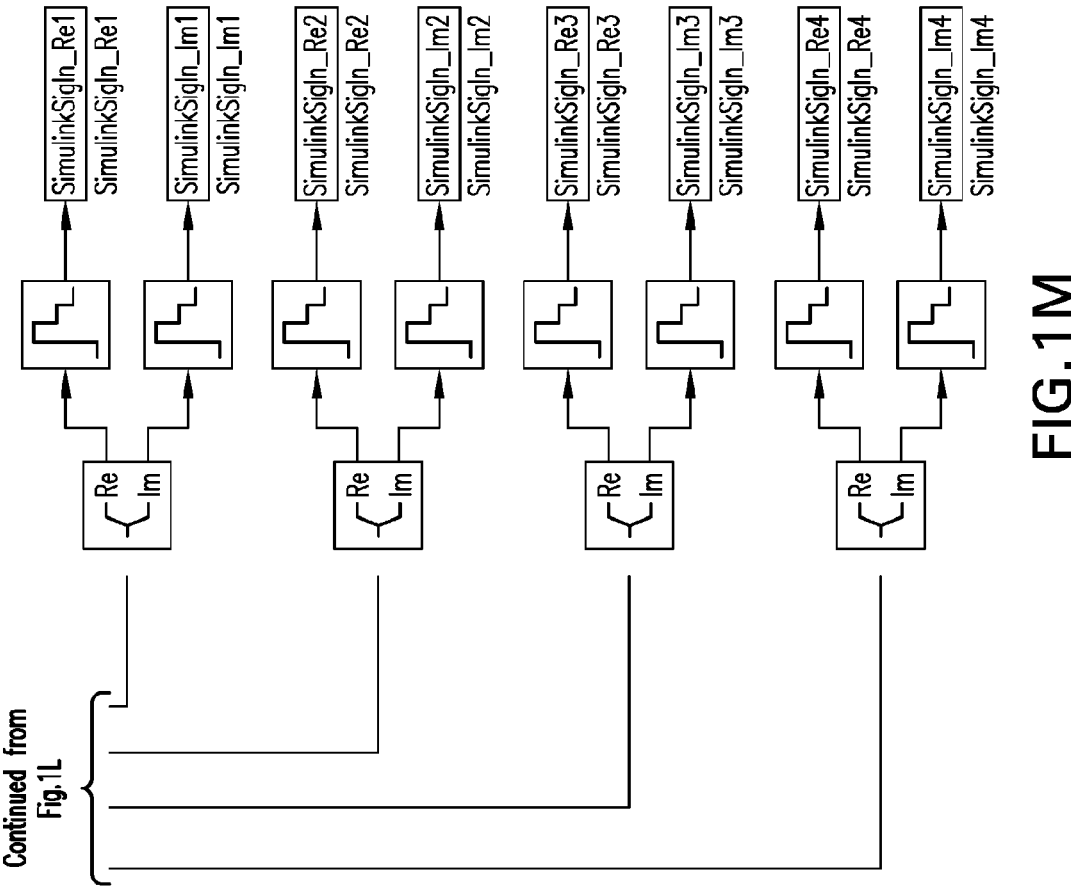
Figure 2A:
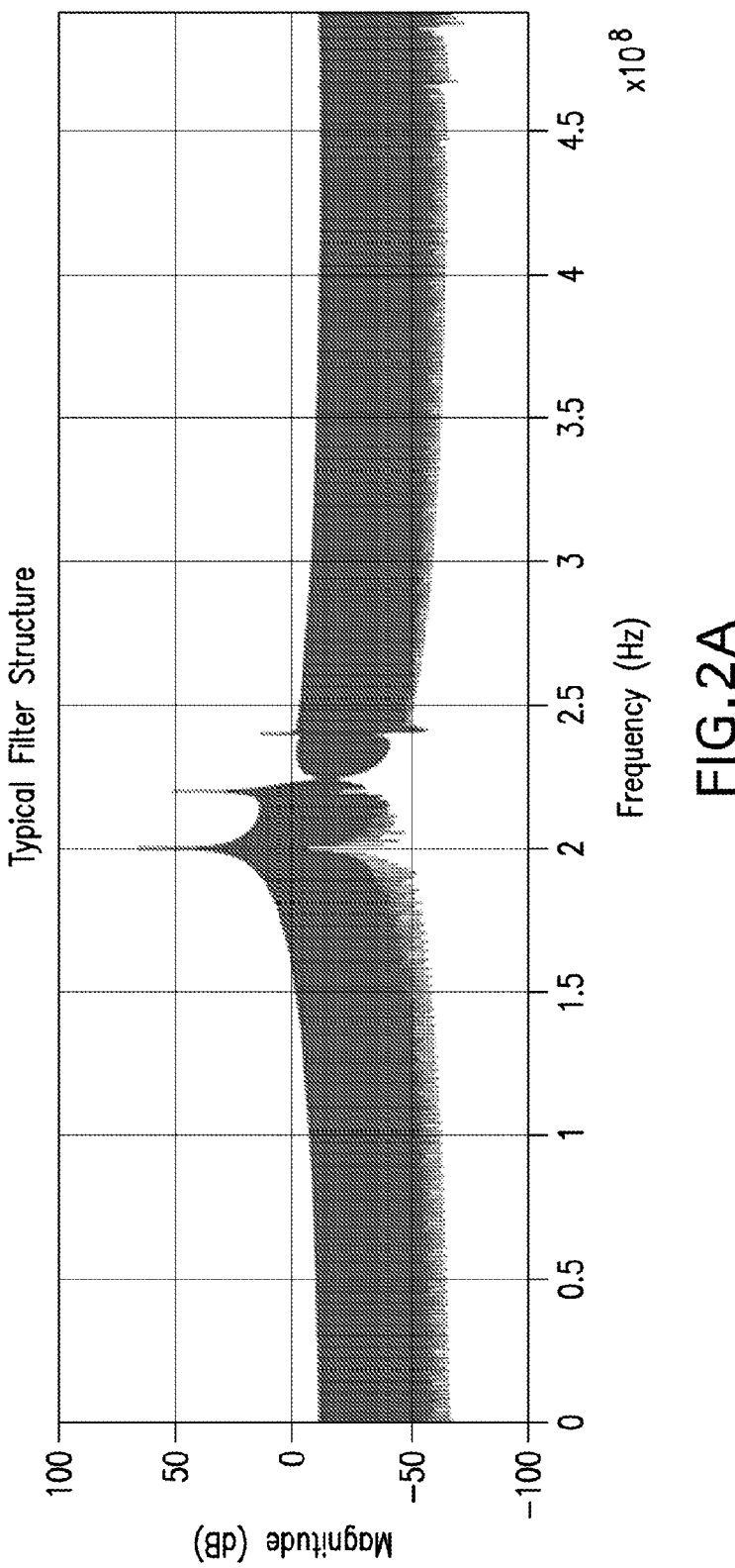
FIGS. 2A-2D are graphs comparing an enhanced filter (FIGS. 2A and 2B) in accordance with embodiments with a conventional filter (FIGS. 2C and 2D).
Figure 2B:
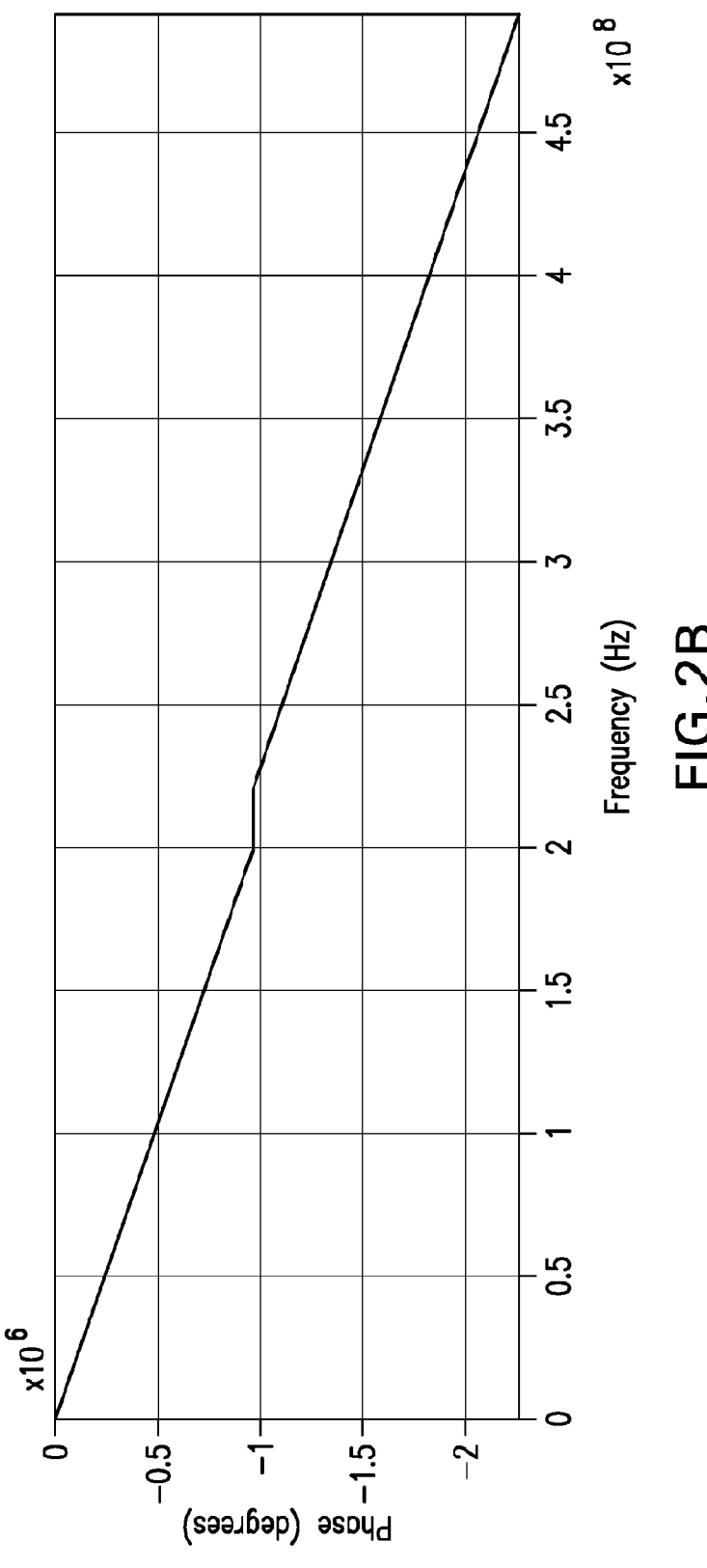
Figure 2C:
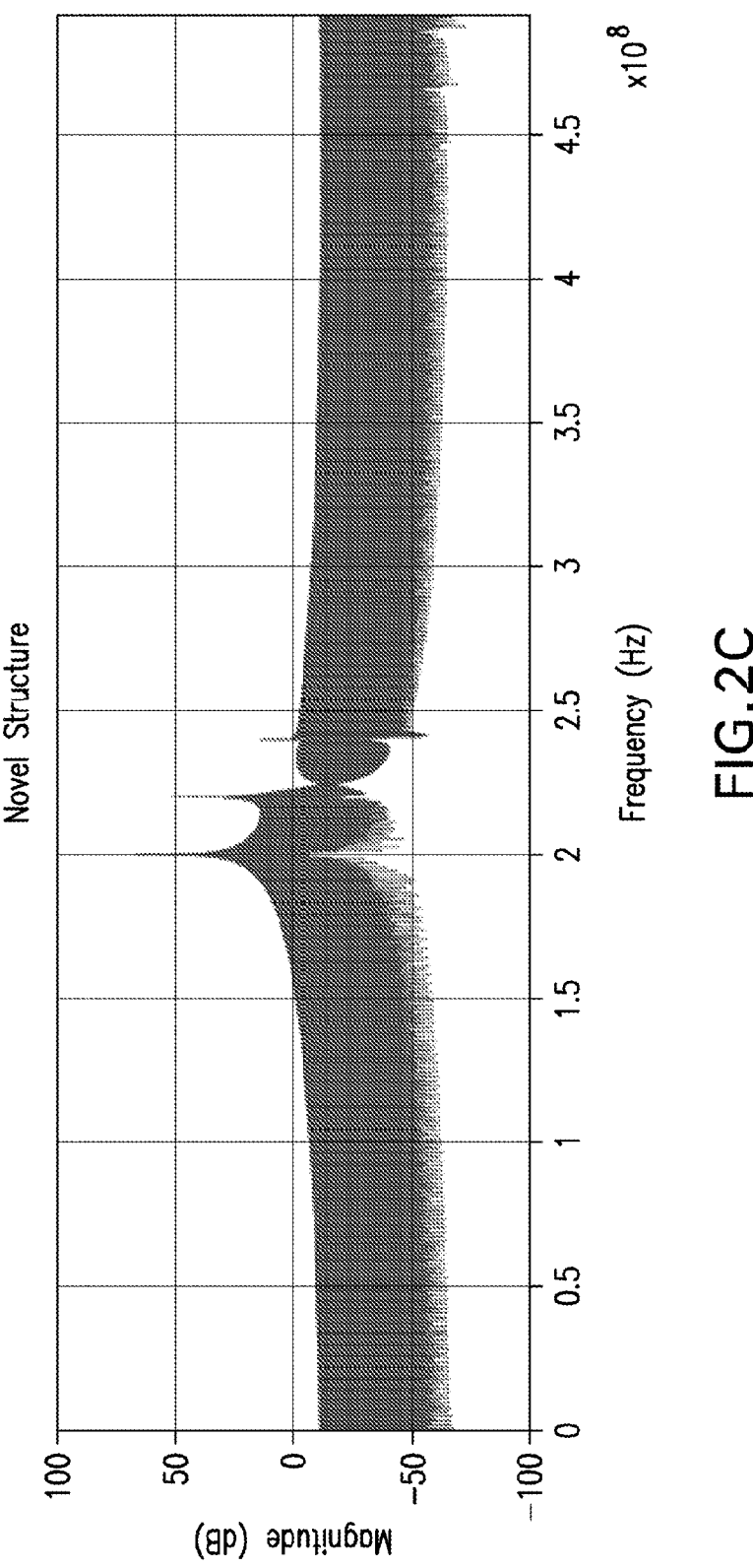
Figure 2D:
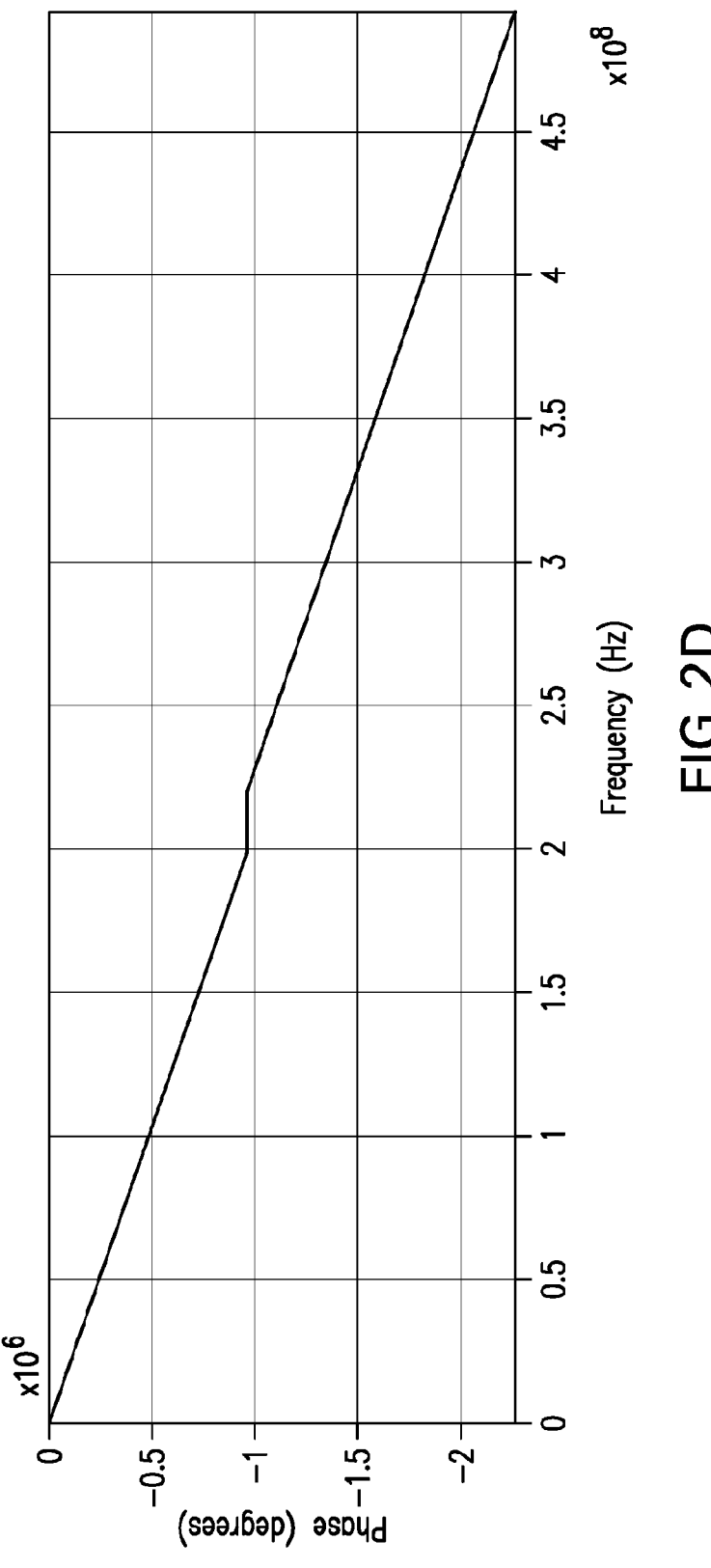
Figures 3A, 3B:
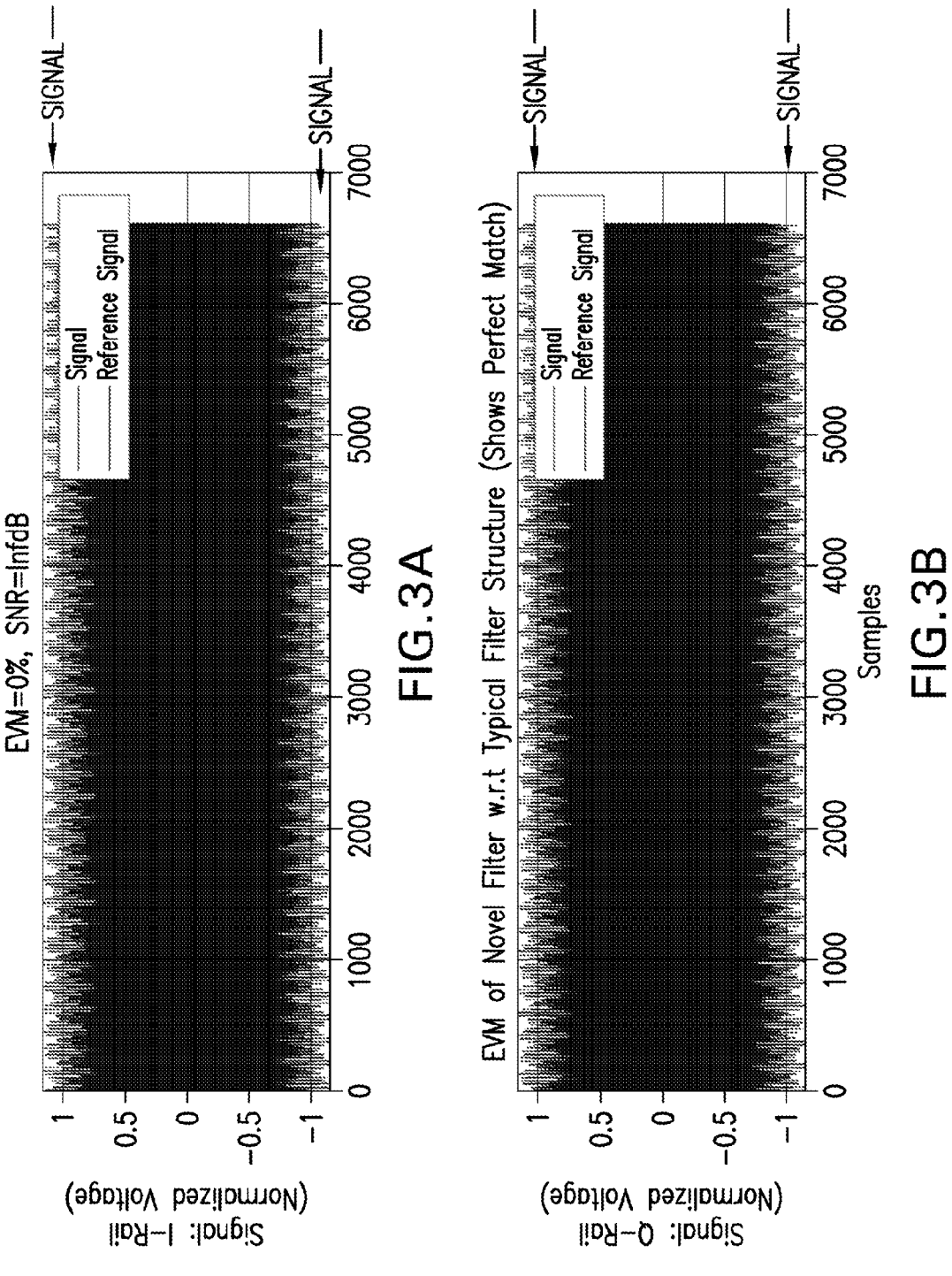
FIGS. 3A-3B are graphs comparing a conventional filter and an enhanced filter in accordance with embodiments.

Form the following indexing vector:

$X_j = [X_{0,j}(1), X_{1,j}(1), X_{2,j}(1), \ldots, X_{K-1,j}(2), X_{0,j}(2), X_{1,j}(2), X_{2,j}(2), \ldots, X_{K-1,j}(2), \ldots, X_{0,j}(Z), X_{1,j}(Z), X_{2,j}(Z), \ldots, X_{K-1,j}(Z),]$ The above vector is physically implemented by interlacing output lines corresponding to the contents of the K buffers in the manner described by the indexing vector above, prior to multiplying such contents by the FIR filter taps as described in the following equations. A physical implementation is shown in FIGS. 1 and 1A-1M-5, where FIG. 1 is a block diagram of an example filter 1000 in accordance with embodiments, FIG. 1A is a layout of the exploded views of FIG. 1, and FIGS. 1B-1M are block diagrams of parts of the filter 1000. The filter 1000 illustrates segmentation (1100) of an input signal with a first rate into a defined number of streams, wherein the defined number of streams sets an effective sample rate of each stream to at least less than a second rate and the second rate is less than the first rate, FIR filter and filter coefficient generation and grouping (1200), application of a subset of filter coefficients to a corresponding stream (1300), and combining at least some outputs from the defined number of streams conditionally based on the second rate (1400).

Form the following K×N outputs:

$$y_{n,k,j} = \sum_{l=0}^{\left\lfloor \frac{L}{N} \right\rfloor - 1} h_{n-(Nl)} \cdot X_j(n + k); n = 0, 1, 2, \ldots N$$

$$Y_{k,j} = [y_{0,k,j}, y_{1,k,j}, \ldots, y_{N-1,k,j}]$$

$$Y_j = [Y_{0,j}, Y_{1,j}, \ldots, Y_{K-1,j}]$$

$$Y_{output} = [Y_0, Y_1, \ldots]$$

$$y_{m,output} = Y_{output}(Mm); m = 0, 1, 2, 3, \ldots$$

As shown, the above re-formulation of the computation enables processing at a rate Fs_Process despite the fact that the samples are coming at a much higher rate Fs_ADC, yet produce the same exact mathematical equivalent outcome.

This can be seen with reference to the graphs shown in FIGS. 2A-2D and 3A-3B. The figures show spectral and time-domain Error Vector Magnitude (EVM) simulation results which demonstrate a perfect match between the described architecture and the traditional architecture. As seen, the enhanced filter results in (exactly) the same numeric output as the traditional FIR design with exact zero error. However, the enhanced architecture has the advantage of being capable of processing at a much lower sample/clock rate than traditional architectures.

Figure 4:
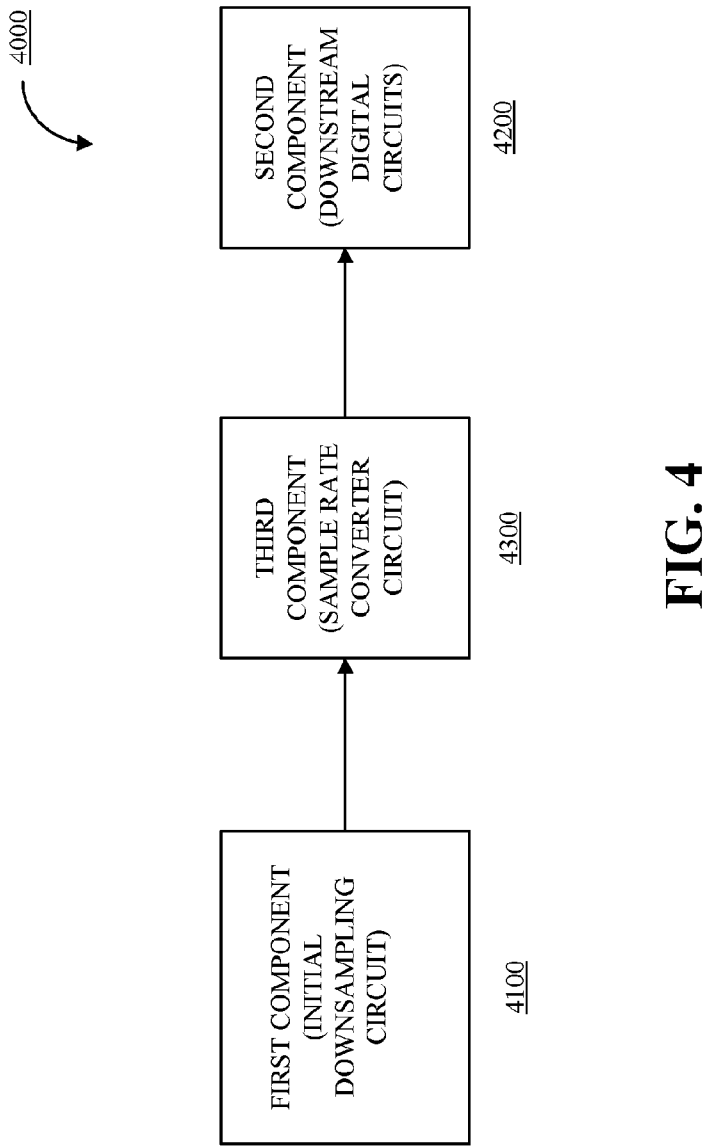
FIG. 4 is a block diagram of an example system in accordance with embodiments.

FIG. 4 is a block diagram of an example system 4000 in accordance with embodiments. The system 4000 can include a first component, circuit, device, module, or hardware (collectively "component") 4100 which can output a first rate without aliasing an input signal which is input to the first component, a second component 4200 which can handle input signals up to a second sample rate, where the second sample rate is less than the first rate, and a third component 4300 which can process the output signal with the first rate to match or be less than the second rate without aliasing. For example, the first component 4100 can be an ADC, DAC, or other initial downsampling circuit. For example, the third component 4300 can be a sample rate converter or filter circuit as described herein. For example, second component 4200 can be downstream digital circuits.

The third component 4300 can segment or split the output signal into a defined number of streams where the effective sample rate of each stream is less than the second rate. The third component 4300 can include, generate, and/or determine a finite impulse response (FIR) filter and filter coefficients. The third component 4300 can group the filter coefficients into multiple filter coefficient subsets corresponding to the defined number of streams. For each of the defined number of streams, the third component 4300 can apply a filter coefficient subset to a corresponding stream. In implementations, the third component 4300 can include or use a buffer mechanism or circuit to multiply the samples in a stream with the corresponding filter coefficient subset. This can be done in a parallel process for the defined number of streams. The third component 4300 can input the outputs of each of the defined number of streams to a combiner. In implementations, the combiner can sum all the outputs. In implementations, the combiner can sum some of the outputs based on matching the second rate without aliasing. In implementations, the combiner can sum some of the outputs based or being less than the second rate without aliasing. In implementations, the third component 4300 can be integrated with the first component 4300.

Figure 5:
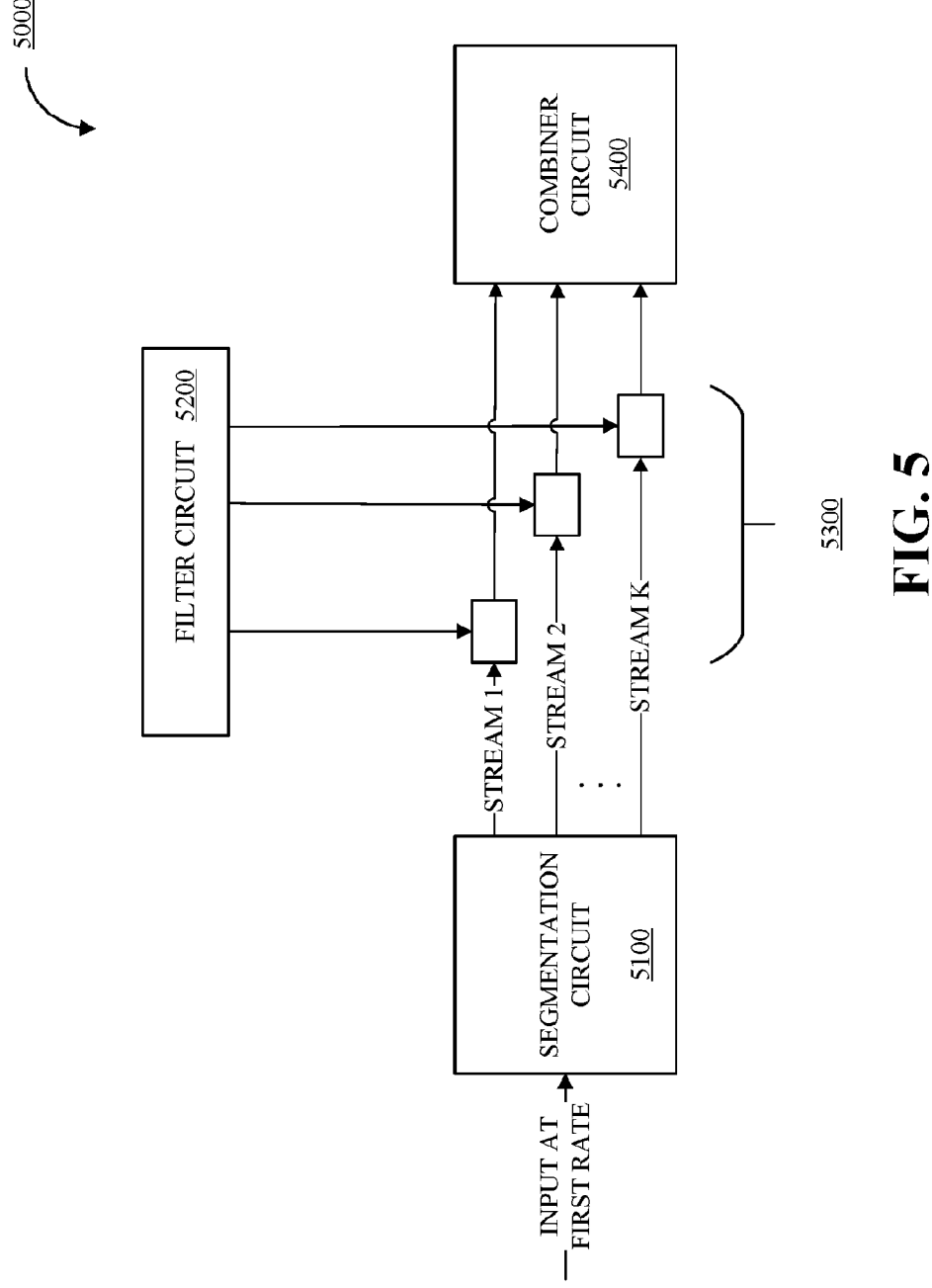
FIG. 5 is a block diagram of an example filter or sample rate converter circuit in accordance with embodiments.

FIG. 5 is a block diagram of an example filter or sample rate converter circuit 5000 in accordance with embodiments. The filter or sample rate converter circuit 5000 can be implemented as the third component 1200 of FIG. 4. The filter or sample rate converter circuit 5000 can include a segmentation circuit 5100 which can segment or split the output signal into a defined number of streams (e.g., streams 1, 2, . . . , K) where the effective sample rate of each stream is less than the second rate. The filter or sample rate converter circuit 5000 can include a filter circuit 5200 which can include, generate, and/or determine a finite impulse response (FIR) filter and filter coefficients. The filter or sample rate converter circuit 5000 can group the filter coefficients into multiple filter coefficient subsets corresponding to the defined number of streams. The filter or sample rate converter circuit 5000 can include buffers 5300 which can apply a filter coefficient subset to a corresponding stream. In implementations, the buffers 5300 can be a buffer mechanism or circuit to multiply the samples in a stream with the corresponding filter coefficient subset. The application or multiplication can be done in a parallel process for the defined number of streams. The buffers 5300 can output coefficient applied streams to an input of a combiner circuit 5400. In implementations, the combiner 5400 can sum all the outputs. In implementations, the combiner 5400 can sum some of the outputs based on matching the second rate without aliasing. In implementations, the combiner 5400 can sum some of the outputs based or being less than the second rate without aliasing.

Figure 6:
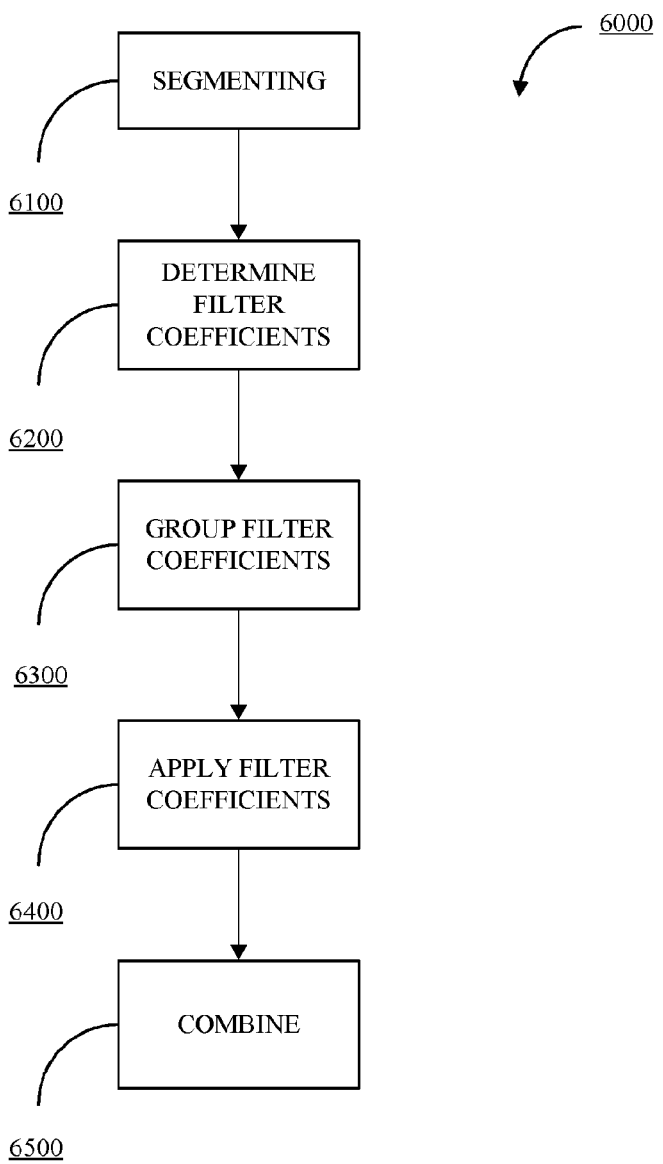
FIG. 6 is a flowchart of an example method for constrained sampling rate filtering in accordance with embodiments.

FIG. 6 is a flowchart of an example method 6000 for constrained sampling rate filtering in accordance with embodiments. The method 6000 can include segmenting 6100 an input signal with a first rate into a defined number of streams, wherein the defined number of streams sets an effective sample rate of each stream to at least less than a second rate and the second rate is less than the first rate. The method 6000 can include determining 6200 filter coefficients for a finite impulse response filter and grouping 6300 the filter coefficients into subsets of filter coefficients to match the defined number of streams. The method 6000 can include applying 6400 in parallel, for each of the defined number of streams, a subset of filter coefficients to a corresponding stream. In implementations, the applying 6400 can include or use a buffer mechanism or circuit to multiply the samples in a stream with the corresponding filter coefficient subset. The method 6000 can include combining 6500 at least some outputs from the defined number of streams based on matching or being less than the second rate without aliasing. In implementations, the combining 6500 can sum all the outputs. In implementations, the combining 6500 can sum some of the outputs based on matching the second rate without aliasing. In implementations, the combining 6500 can sum some of the outputs based or being less than the second rate without aliasing. The method 6000 can be implemented in the circuit 1000 of FIGS. 1 and 1A-1M, the system 4000 of FIG. 4, and the filter or sample rate converter circuit 5000 of FIG. 5, as appropriate and applicable.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A method for constrained sampling rate filtering, the method comprising:

receiving a first input signal;

outputting an output signal with a first rate without aliasing the first input signal;

segmenting the output signal into a defined number of streams without aliasing, wherein each stream of the defined number of streams has an effective sample rate not greater than a second rate and the second rate is less than the first rate;

determining filter coefficients for a finite impulse response filter;

grouping the filter coefficients into subsets of filter coefficients to match the defined number of streams;

applying in parallel, for each stream of the defined number of streams, a subset of filter coefficients to a corresponding stream;

combining at least some outputs from the defined number of streams into a combined result signal conditionally based on the second rate, wherein the combined result signal is mathematically equivalent to applying finite impulse response filtering to the output signal at the first rate; and outputting the combined result signal at a rate not greater than the second rate.

2. The method of claim 1, wherein the applying further comprises:

multiplying samples in the corresponding stream with the corresponding filter coefficient subset.

3. The method of claim 1, wherein the combining combines at least some outputs from the defined number of streams based on matching the second rate without aliasing.

4. The method of claim 1, wherein the combining combines at least some outputs from the defined number of streams based on being less than the second rate without aliasing.

5. The method of claim 1, wherein the combining combines all outputs from the defined number of streams.

6. A constrained sampling rate filtering circuit, comprising:

a first circuit configured to receive a first input signal and output an output signal with a first rate without aliasing the first input signal;

a segmentation circuit configured to segment the output signal into a defined number of streams without aliasing, wherein each stream of the defined number of streams has an effective sample rate not greater than a second rate and the second rate is less than the first rate;

a filter circuit configured to determine filter coefficients for a finite impulse response filter;

the constrained sampling rate filtering circuit configured to group the filter coefficients into subsets of filter coefficients to match the defined number of streams;

the constrained sampling rate filtering circuit configured to apply in parallel, for each stream of the defined number of streams, a subset of filter coefficients to a corresponding stream;

a combiner circuit configured to combine at least some outputs from the defined number of streams into a combined result signal conditionally based on the second rate, wherein the combined result signal is mathematically equivalent to applying finite impulse response filtering to the output signal at the first rate; and the combiner circuit configured to output the combined result signal at a rate not greater than the second rate.

7. The constrained sampling rate filtering circuit of claim 6, with respect to application of the subset of filter coefficients to a corresponding stream, further comprising:

a buffer circuit configured to multiply samples in the corresponding stream with the corresponding filter coefficient subset.

8. The constrained sampling rate filtering circuit of claim 6, wherein the combiner circuit configured to combine at least some outputs from the defined number of streams based on matching the second rate without aliasing.

9. The constrained sampling rate filtering circuit of claim 6, wherein the combiner circuit configured to combine at least some outputs from the defined number of streams based on being less than the second rate without aliasing.

10. The constrained sampling rate filtering circuit of claim 6, wherein the combiner circuit configured to combine all outputs from the defined number of streams.

11. A system, comprising:

a first circuit configured to receive an input signal and output an output signal with a first sample rate without aliasing the input signal;

a second circuit configured to handle input signals up to a second sample rate, where the second sample rate is less than the first sample rate; and a third circuit configured to:

process the output signal with the first sample rate from the first circuit by segmenting the output signal with the first sample rate into a defined number of streams, wherein each stream of the defined number of streams has an effective sample rate less than the second sample rate;

apply finite impulse response filtering by processing the defined number of streams in parallel;

combine at least some outputs of the defined number of streams into a combined result signal conditionally based on the second sample rate without aliasing, wherein the combined result signal is mathematically equivalent to applying finite impulse response filtering to the output signal at the first sample rate; and output the combined result signal to the second circuit at a rate not greater than the second sample rate.

12. The system of claim 11, wherein the third circuit further comprising:

a segmentation circuit configured to segment the output signal with the first rate into the defined number of streams.

13. The system of claim 12, wherein the third circuit further comprising:

a filter circuit configured to determine filter coefficients for a finite impulse response filter.

14. The system of claim 13, wherein the third circuit further configured to group the filter coefficients into subsets of filter coefficients to match the defined number of streams.

15. The system of claim 14, wherein the third circuit further configured to apply in parallel, for each of the defined number of streams, a subset of filter coefficients to a corresponding stream.

16. The system of claim 15, with respect to application of the subset of filter coefficients to a corresponding stream, further comprising:

a buffer circuit configured to multiply samples in the corresponding stream with the corresponding filter coefficient subset.

17. The system of claim 15, wherein the third circuit further comprising:

a combiner circuit configured to combine at least some outputs from the defined number of streams into the combined result signal.

18. The system of claim 17, wherein the combiner circuit configured to combine at least some outputs from the defined number of streams based on matching the second rate without aliasing.

19. The system of claim 17, wherein the combiner circuit configured to combine at least some outputs from the defined number of streams based being less than the second rate without aliasing.

20. The system of claim 17, wherein the combiner circuit configured to combine all outputs from the defined number of streams.

* * * * *